United States Patent
Booth (10) Patent No.: US 9,118,219 B2
(45) Date of Patent: Aug. 25, 2015

(54) METHODS AND SYSTEMS FOR DETERMINING AN ASSOCIATION BETWEEN NODES AND PHASES VIA A SMART GRID

(75) Inventor: Derek Edward Booth, Dacula, GA (US)

(73) Assignee: Landis+Gyr Innovations, Inc., Alpharetta, GA (US)

( * ) Notice: Subject to any disclaimer, the term of this patent is extended or adjusted under 35 U.S.C. 154(b) by 681 days.

(21) Appl. No.: 13/177,643

(22) Filed: Jul. 7, 2011

(65) Prior Publication Data

US 2013/0013125 A1 Jan. 10, 2013

(51) Int. Cl.
G01R 19/00 (2006.01)
H02J 13/00 (2006.01)
G01R 29/18 (2006.01)
H02J 3/18 (2006.01)

(52) U.S. Cl.
CPC ............. H02J 13/0013 (2013.01); *G01R 29/18* (2013.01); *H02J 3/1878* (2013.01); *Y02E 40/30* (2013.01); *Y02E 40/74* (2013.01); *Y02E 60/7807* (2013.01); *Y04S 10/22* (2013.01); *Y04S 40/12* (2013.01)

(58) Field of Classification Search
CPC .... G01R 29/18; H02J 13/0013; H02J 3/1878; Y02E 60/7807; Y04S 10/22; Y04S 40/12
USPC .................. 702/64, 62; 700/298, 296; 324/86
See application file for complete search history.

(56) References Cited

U.S. PATENT DOCUMENTS

| | | | | |
|---|---|---|---|---|
| 4,686,630 | A * | 8/1987 | Marsland et al. | 700/296 |
| 2009/0129376 | A1 * | 5/2009 | Johnson | 370/357 |
| 2009/0256686 | A1 * | 10/2009 | Abbot et al. | 340/310.11 |
| 2010/0060259 | A1 * | 3/2010 | Vaswani et al. | 324/86 |
| 2010/0324844 | A1 * | 12/2010 | Marti | 702/61 |
| 2011/0161022 | A1 | 6/2011 | Caird | |
| 2012/0200279 | A1 * | 8/2012 | Pamulaparthy et al. | 323/301 |

FOREIGN PATENT DOCUMENTS

| | | |
|---|---|---|
| EP | 2388600 | 11/2011 |
| WO | 2013006273 | 1/2013 |
| WO | 2013006273 | 3/2013 |

OTHER PUBLICATIONS

PCT/US2012/043311, "International Search Report and Written Opinion", Jan. 22, 2013, 11 Pages.

(Continued)

*Primary Examiner* — Janet Suglo (74) *Attorney, Agent, or Firm* — Kilpatrick Townsend & Stockton LLP (57) ABSTRACT

Determining the number of loads associated with each phase in a three-phase electric power system. The loads can be associated with the consumption of electric power at a node, such as a metering device located at a facility. In one implementation, a central device that is connected to such nodes via a smart grid and a radio frequency mesh network can be leveraged to determine a phase in real time. For example, the central device can include a processor that executes one or more computer program modules which can cause a load tap changer having access to a distribution feeder in the smart grid to vary a voltage level supplied across each phase of the power system. Additionally, the central device can communicate with nodes in the mesh network to cause the nodes to perform voltage measurements and collect information related to such measurements.

12 Claims, 6 Drawing Sheets

(56) References Cited

OTHER PUBLICATIONS

Dilek, Murat, "Integrated Design of Electrical Distribution Systems: Phase Balancing and Phase Prediction Case Studies", Dissertation submitted to the Faculty of the Virginia Polytechnic Institute and State University in partial fulfillment of the requirements for the degree of Doctor of Philosophy in Electrical Engineering, 2001, 141 pages.

PCT/US2012/043311, "International Preliminary Report on Patentability", Jan. 16, 2014, 8 pages.

Mexican Application No. MX/a/2014/000143, Office Action mailed on Feb. 16, 2015, Redacted, 6 pages.

* cited by examiner

METHODS AND SYSTEMS FOR DETERMINING AN ASSOCIATION BETWEEN NODES AND PHASES VIA A SMART GRID

TECHNICAL FIELD

This invention relates generally to electric power systems and more specifically to a software module that communicates with a load tap changer, or similar voltage regulating device, and selected nodes in a mesh network to collect and analyze information for correcting load imbalances in three-phase power systems.

BACKGROUND

Three-phase power systems are widely used to provide electric power to consumers. Efficient operation of such systems requires that loads are properly balanced across each phase. Unfortunately, load imbalances can be a common occurrence. Various systems such as power line carrier or power line communication systems offer an integrated solution to resolving such imbalances in part by leveraging the distribution feeder network to collect and analyze phase-related information, real-time, in a centralized location. Power line carrier systems, however, represent only one medium for correcting imbalances. Other systems that leverage existing network connectivity between centralized locations and devices capable of obtaining phase-related information that can be used to correct load imbalances are also desirable.

SUMMARY

Various aspects of the present invention relate to determining an association between nodes in a mesh network and electric power phases. In one aspect, a load tap changer can be instructed to apply an initial voltage level to the first electric power phase, the second electric power phase, and the third electric power phase. The initial voltage level is applied for an initial period. The load tap changer can also be instructed to apply a first voltage to the first electric power phase and to apply a second voltage to the second electric power phase and the third electric power phase for a first period. A plurality of nodes in a mesh network can be instructed to perform a plurality of voltage measurements during the first period. Information related to the plurality of voltage measurements taken during the first period can be received from nodes in the mesh network. The information can be processed to determine which nodes are associated with the first electric power phase. Similar steps can be performed to determine which nodes are associated with a second and third electric power phase.

In another aspect, an initial voltage for an initial period can be received. A first voltage for a first period, a second voltage for second period, and a third voltage for a third period can also be received. A plurality of measurements can be taken during the first period, the second period, and the third period. The voltage measurements during two of the first, second, and third periods are similar and the received voltage during the remaining period is dissimilar. Receiving the voltages and taking the voltage measurements occur at nodes within a mesh network.

These illustrative examples are mentioned not to limit or define the disclosure, but to provide examples to aid understanding thereof. Additional examples and further description are provided in the Detailed Description.

BRIEF DESCRIPTION OF THE FIGURES

These and other features, aspects, and advantages of the present disclosure are better understood when the following Detailed Description is read with reference to the accompanying drawings, where:

FIG. 5b depicts voltage measurements taken by various nodes based on the voltage applied to the electric power phases indicated in FIG. 5a.

DETAILED DESCRIPTION

Aspects of the present invention relate to determining the number of loads associated with each phase in a three-phase electric power system. The loads can be associated with the consumption of electric power at a node, such as a metering device located at a facility. In one aspect, a central device that is connected to such nodes via a smart grid and a radio frequency mesh network can be leveraged to determine a phase in real time. For example, the central device can include a processor that executes one or more computer program modules which can cause a load tap changer having access to a distribution feeder in the smart grid to vary a voltage level supplied across each phase of the power system. Additionally, the central device can communicate with nodes in the mesh network to cause the nodes to perform voltage measurements and to collect information related to such measurements.

According to one implementation, the central device controls a recursive process in which voltage levels are varied depending on phase and voltages are measured. For example, the central device can cause the load tap changer to set the voltage across each phase to an initial level for an initial period. After the initial period has expired, the central device can cause the load tap changer to increase the voltage level applied to a first phase of the power system, e.g., Phase A, by a certain amount, while causing the load tap changer to decrease the voltage level applied to Phase B and Phase C, by a certain amount. The voltage levels can remain in effect for a particular period, during which time the nodes measure a first set of voltage measurements. A second and third set of voltage measurements can be measured by repeating the above steps. For instance, the second set of voltage measurements can be measured in conjunction with an increase in voltage level applied to a second phase, e.g., Phase B, and a decrease in voltage level applied to Phase A and Phase C. The third set of voltage measurements can be measured in conjunction with an increase in voltage level applied to a third phase, e.g., Phase C, and a decrease in voltage level applied to Phase A and Phase B.

According to some examples, after the first, second, and third set of voltage measurements are received at the central device, information related to the voltage measurements can be analyzed to determine an association between nodes and phases, such as an indication of the number of loads associated with a particular phase or the phase associated with each node. The information can be used to make other determinations in other aspects of the invention. Nodes can be configured to measure voltages, optionally store the measured voltages, and send the information related to the measured voltages to the central device. The information can be sent at various times, e.g., batch or real-time as each measurement is taken, according to various implementations. The information can be routed to the central device via one or more nodes in the mesh network.

As used herein, the term "device" refers to any computing or other electronic equipment that executes instructions and includes any type of processor-based equipment that operates an operating system or otherwise executes instructions. A device will typically include a processor that executes program instructions and may include external or internal components such as a mouse, a CD-ROM, DVD, a keyboard, a display, or other input or output equipment. Examples of devices are personal computers, digital assistants, personal digital assistants, cellular phones, mobile phones, smart phones, pagers, digital tablets, laptop computers, Internet appliances, other processor-based devices, and television viewing devices.

The central device 10 is used as a special purpose computing device to provide specific functionality offered by its applications. In embodiments herein, it acts as a "central" location or hub for receiving information from various nodes in the mesh network 15, as well as a central command center for initializing and controlling the features described herein.

As used herein, a "node" refers to a device that can measure voltages at a facility, such as a house, apartment unit or other place of dwelling, or other type of end point that may rely upon electric power. The node can include hardware and software that configures it to communicate with like nodes and/or other devices via mediums to which it has connectivity, such as a smart grid or a mesh network. In one implementation, the node is a meter that measures the consumption of electric power at a facility. Thus, a node can represent the "load" at any given time at a certain location along a distribution feeder in a power system.

As used herein, a "load tap changer" refers to a device that can regulate voltage originating from a power source, such as a substation. The voltage levels can be regulated on a per phase basis.

Claims that follow recite a "computer-readable medium." A computer-readable medium may comprise, but is not limited to, an electronic, optical, magnetic, or other storage device capable of providing a processor with computer-readable instructions. Other examples comprise, but are not limited to, a floppy disk, CD-ROM, DVD, magnetic disk, memory chip, ROM, RAM, an ASIC, a configured processor, optical storage, magnetic tape or other magnetic storage, flash memory, or any other medium from which a computer processor can read instructions. The instructions may comprise processor-specific instructions generated by a compiler and/or an interpreter from code written in any suitable computer-programming language, including, for example, C, C++, C#, Visual Basic, Java, Python, Perl, JavaScript, and ActionScript.

Figure 1:
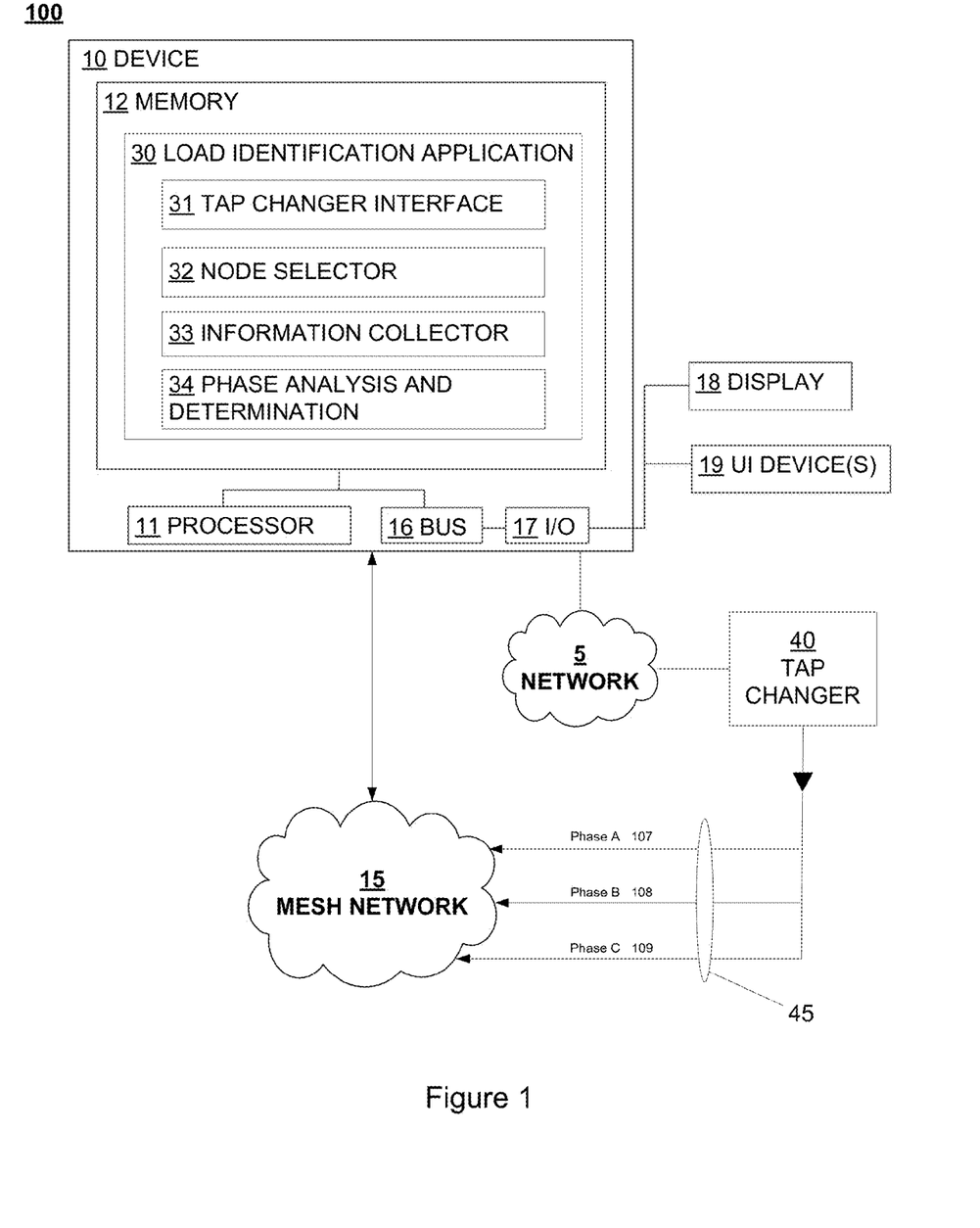
FIG. 1 depicts an exemplary environment for determining an association between nodes and electric power phases.

FIG. 1 depicts an exemplary environment for implementing systems described herein. The environment shown in FIG. 1 comprises a wired or wireless network 5 to which a central device 10 and a load tap changer 40 are connected. The network 5 can comprise the Internet. Alternatively, other networks, intranets, or combinations of networks may be used such that devices connected to the network 5 may communicate with each other. Other environments do not involve a network and may, for example, rely upon a single device or on devices that are directly connected to one another, e.g., the central device 10 may be directly connected to the load tap changer 40. Other alternative networks, computer devices, and electronic device configurations are also possible.

Figure 2:
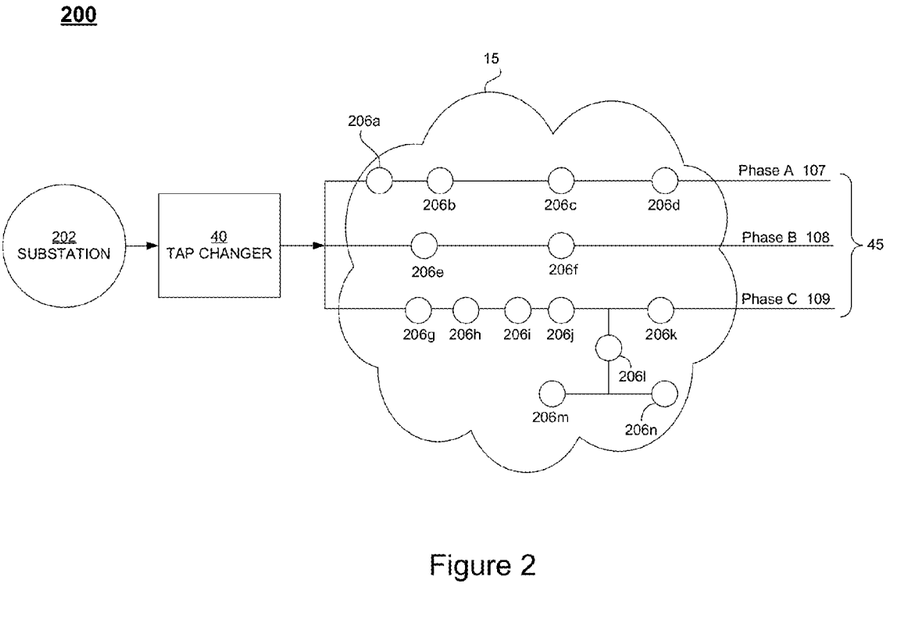
FIG. 2 illustrates an electric power system in which nodes of a mesh network are distributed along electric power phases carried by a distribution feeder.

The environment in FIG. 1 may also contain a network 15. In one implementation, the network 15 is a wireless mesh network comprising multiple nodes that can communicate with one another to route information to the central device 10. Similarly, the nodes in the mesh network 15 may also route messages from the central device 10 to other nodes in the mesh network 15. FIG. 2 depicts individual nodes 206a-n in the mesh network 15. Additionally, the nodes in the mesh network 15 can be associated with one of multiple phases 107 (Phase A), 108 (Phase B), and 109 (Phase C) of an electric power distribution system comprising distribution feeder 45, as illustrated in FIG. 1. Thus, a node according to aspects herein can function within a mesh network 15 and a distribution feeder 45 of an electric power distribution system.

The central device 10 shown in FIG. 1 can include a processor 11 for executing computer instructions embodied in the load identification application 30 and an input/output device 17 connected to the processor 11 via a bus 16. Users can use a display 18 and one or more user interface devices 19, such as a mouse and keyboard, to interact with the central device 10. A memory 12 can include the load identification application 30, which can include various computer program modules, such as a load tap changer interface 31, a node selector 32, an information collector 33, and a phase analysis and determination module 34.

Each of these modules can be implemented as individual modules that provide specific functionality of the load identification application 30. For example, the load tap changer interface 31 can cause the load tap changer 40 to vary the voltage level applied to each phase carried by the distribution feeder 45. The node selector 32 can implement various algorithms that can be used to select certain nodes for performing voltage measurements. An information collector 33 can receive and parse information related to the voltage measurements that are received from one or more nodes in the mesh network 15 which route the information from the nodes that performed the voltage measurements to the central device 10. The phase analysis and determination module 34 can process the information to determine an association between nodes and phases.

In some implementations, at least some of the above program modules can be located on devices other than the central device 10. For example, the phase analysis and determination module 34 can be executed by a processor on a device that is connected to the device 10 via the network 5 or via the network 15. In other implementations, the program modules can communicate with one or more other program modules, on the device 10 or on another device, to provide specific functionality for determining an association between nodes and phases. In these implementations, determining a phase association may represent only one function or feature within a broader software application that provides numerous other additional functions or features. In other implementations, the functionality provided by the various program modules can be implemented in a single module.

FIG. 2 illustrates a distribution feeder 45 that carries power from power source 202 to nodes 206a-n which can be located at a facility. The load tap changer 40 can regulate the voltage level received from the power source 202 to control the voltage level present at the nodes 206a-n.

FIG. 2 also illustrates a relationship between the mesh network 15 and the phases 107, 108, and 109 carried by distribution feeder 45. Such a relationship exists by way of nodes 206a-n which are common to the mesh network 15 and to power distribution feeder 45. FIG. 2 illustrates four nodes (206a-d) connected to 107 (Phase A), two nodes (206e-f) connected to 108 (Phase B), and eight nodes (206g-n) connected to 109 (Phase C). Although only fourteen nodes are shown, fewer or more nodes may exist. The dotted cloud 15 represents the mesh network and illustrates that the nodes 206a-n also have a relationship with one another in the mesh network 15.

In some systems, a node can include the phase analysis and determination module 34. According to these systems, the node can access the stored voltage measurements from a local memory, or another external memory accessible by the node, and determine the phase with which the node is associated. The node can send the results to the central device 10 instead of the central device 10 performing the phase analysis and determination to obtain the results.

Figure 3:
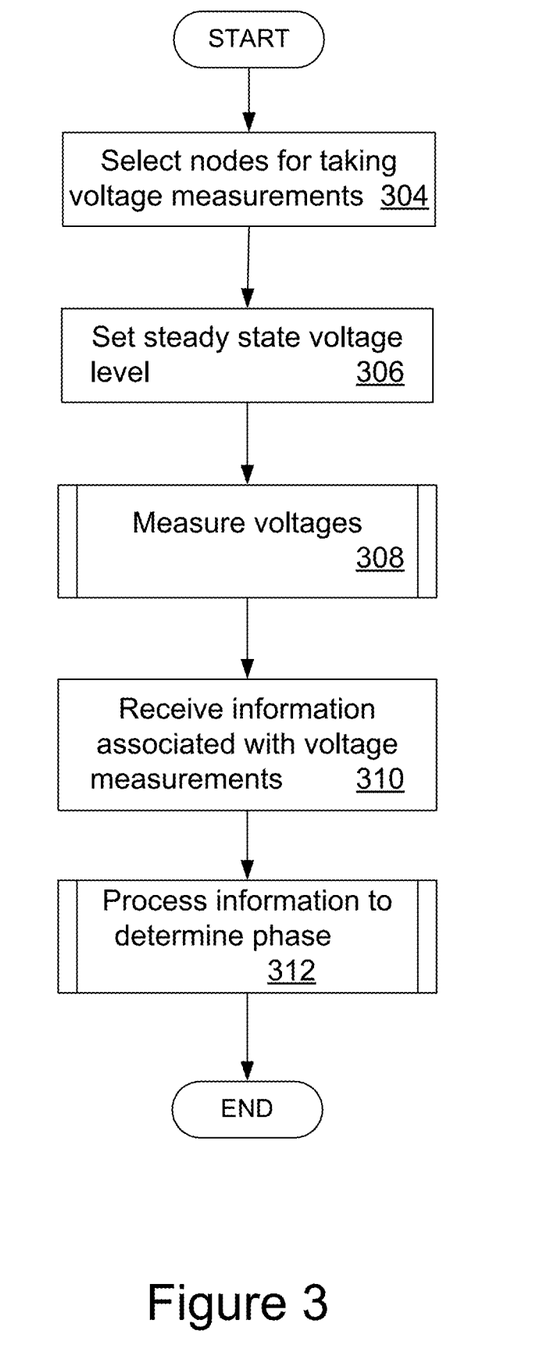
FIG. 3 is a flowchart illustrating a computer-implemented method for determining an association between nodes and electric power phases.

FIG. 3 is a flowchart of an exemplary phase determination method. Phase determination begins at step 304 where certain of the nodes 206a-n on the distribution feeder 45 are selected to participate in the phase determination by performing voltage measurements and sending information related to the voltage measurements to the central device 10. In some implementations, various algorithms can be implemented to select certain nodes. For example, nodes can be selected based on their location. Locations that are experiencing rapid growth may be more prone to load imbalances than more stable locations and therefore nodes associated with those locations may be desirable candidates. As another example, nodes that are associated with a facility that is experiencing trouble or inefficient operation may also be desirable candidates. Nodes in proximity to troubled nodes may also be selected according to some algorithms. In other implementations, all nodes located on one or multiple distribution feeders can be selected. Various other algorithms and/or logic can utilize metrics or data associated with various other conditions to determine which nodes will be selected.

At step 306, the voltage applied to 107 (Phase A), 108 (Phase B), and 109 (Phase C) can be set to an initial voltage level and held at that level until the system achieves a steady state. In one example, steady state is achieved by applying the initial voltage for an initial period sufficient to allow voltage to propagate throughout the nodes, e.g., thirty minutes. The load tap changer interface 31 can use a predetermined value for the initial period or can determine the value based on certain data, e.g., historical periods stored in a memory or database accessible by the load tap changer interface 31. In some examples, the load tap changer interface 31 can receive input or an instruction specifying the period.

In other examples, the load tap changer interface 31 can determine whether the voltage has propagated throughout the nodes. For example, the load tap changer interface 31 can cause the candidate nodes to measure voltage on demand and send the measured voltages real time to the central device 10. The measured voltages can be compared to the steady state voltage level such that measured voltages that are equal to or within an acceptable range of the steady state voltage level can be considered to have received the initial voltage. In some implementations, the central device 10 may conclude that the initial voltage has been propagated throughout the nodes after a predefined percentage of the nodes have measured a voltage equal to or within an acceptable range of the steady state voltage. Relying on a percentage can effectively exclude from the determination any nodes that may be experiencing trouble.

Certain other implementations can rely on known location data for each node. For example, the load tap changer interface 31 can cause nodes that are at the farthest points away from the load tap changer 40 to measure voltages. The initial voltage can be considered fully propagated throughout the nodes when such nodes indicate that they measured a voltage equal to or within an acceptable range of the initial voltage. Similar techniques can be used to verify that additional voltage levels applied to each of the phases, e.g., 2.0 volts above steady state voltage and 1.0 volts below steady state voltage, have been propagated throughout the nodes.

Figure 4:
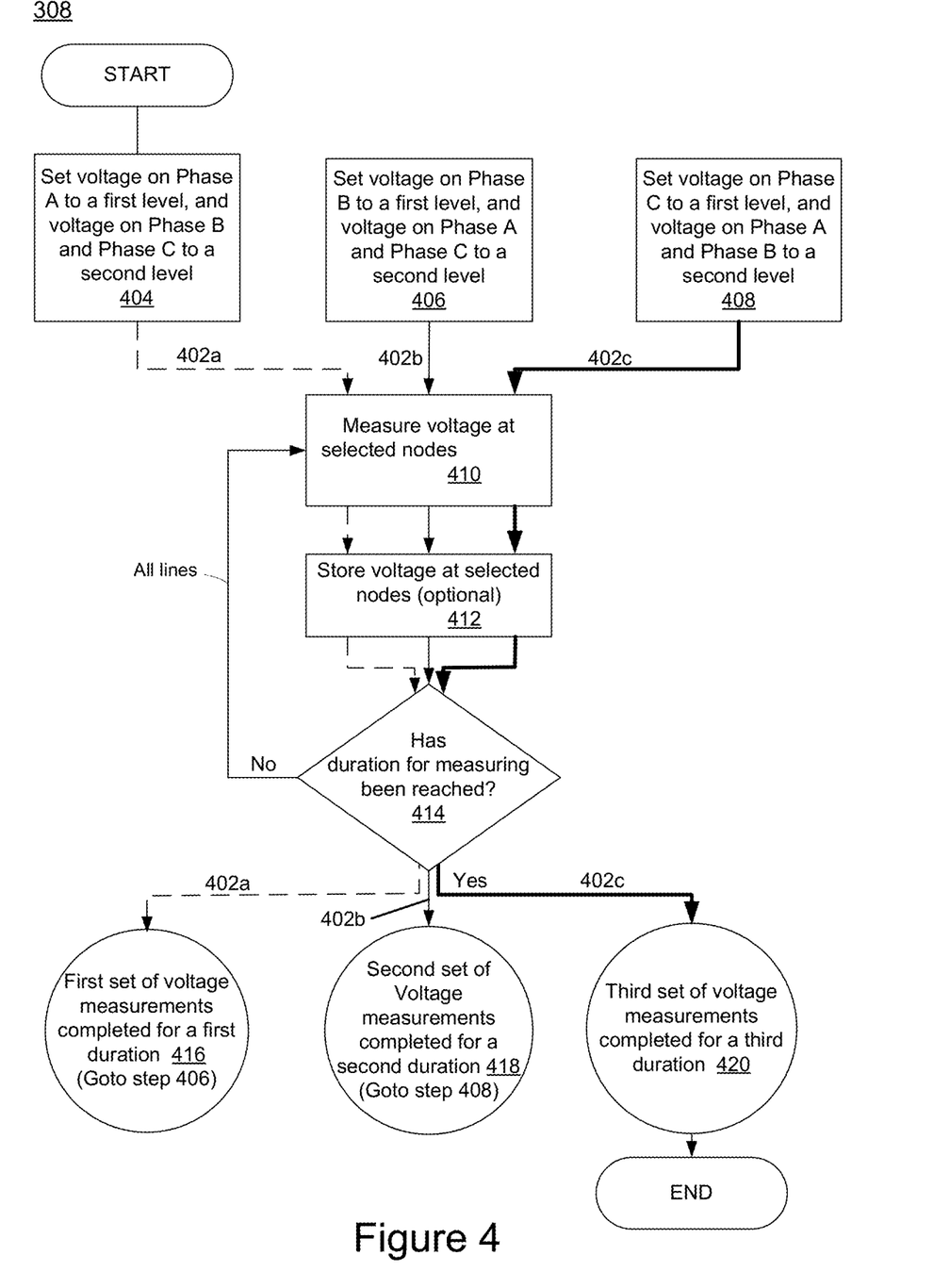
FIG. 4 is flowchart illustrating an exemplary process for establishing and measuring voltages in the environment of FIG. 1.

Voltages can be measured at step 308. FIG. 4 illustrates an exemplary process for measuring voltages. At step 404, the voltage applied to Phase A is set to a first voltage, and the voltage applied to Phase B and Phase C is set to a second voltage. In one example, the voltage applied to Phase A is 2 volts higher than the initial voltage level, whereas the voltage applied to Phase B and Phase C is 1 volt lower than the initial voltage level. Phase B may receive a voltage that is different from that received by Phase C in some implementations.

The amount of voltage increase and decrease may be different in some implementations, so long as the voltage level is within acceptable tolerances, i.e., between 114 volts and 126 volts. Thus, a voltage differential of 3 volts (+2 volt increase and a −1 volt decrease) can be used. Other voltage differentials can also be used.

The selected nodes can begin measuring voltage at step 410. In one system, the voltages can be measured for a first period. The first period can be the same as or different from the initial period used at step 306. Similar to the initial period, certain data may be evaluated to determine the duration of the first period or, alternatively, the duration of the first period can be communicated to the node. Measurements can be taken over the first period at certain intervals of time. For example, nodes can measure voltages once a minute. In one implementation, the nodes are programmed to record voltage measurements at a predefined time interval. In other implementations, the nodes can receive a time interval from the central device 10. Thus, according to these implementations, the central device 10 can effectively control the number of measurements taken by each node, i.e., requesting that a node measure voltage every minute for thirty minutes to arrive at a total of thirty measurements.

Information related to the voltage measurements can be optionally stored by the nodes at step 412. Storing the information at the nodes can be particularly useful when information for multiple measurements is sent to the central device 10 in a single message or when the nodes include the phase analysis and determination module. The voltage measurements can be sent to the central device 10 at a determined or scheduled time or based on network activity. For example, information can be sent at a time during which the load on the mesh network 15 is relatively low, i.e., relatively few messages are being routed. In some implementations, voltage measurements may not be stored, particularly in those systems where voltage measurements are sent in real time, e.g., after each voltage measurement is performed, to the central device 10.

The process determines whether the end of the first period has been reached at step 414. If so, then the first set of voltage measurements have been effectively completed at reference 416. Processing can resume at step 406 where Phase B is set to a first voltage (e.g., the same first voltage applied to Phase A in step 404) and Phase A and Phase C are set to a second voltage (e.g., the same second voltage applied to Phase B and Phase C in step 404). Steps 410 and 412 are repeated until a second period, which can be the same as or different from the first period and/or initial period, expires at step 414. If the end of the second period has been reached, the second set of voltage measurements have been effectively completed at reference 418. Steps 410 and 412 are repeated after processing resumes at step 408, where a first voltage is applied to Phase C (e.g., the same first voltage applied to Phase A in step 404 and to Phase B in step 406) and a second voltage is applied to Phase A and to Phase B (e.g., the same second voltage that was applied to Phase B and to Phase C in step 404 and to Phase A and Phase C in step 406). The third set of voltage measurements are effectively completed at reference 420 after a third period has expired at decision step 414. Voltage measurements can also be taken during the initial period according to some implementations to, for example, verify that the steady state voltage is achieved by the conclusion of the initial period.

In some implementations, the first period, the second period, and the third period are equivalent. They may also be different in other implementations. Dotted line 402a, solid line 402b, and bold line 402c of FIG. 4 join the respective steps performed for each of the voltage settings applied at steps 404, 406, and 408, respectively.

Figure 5A:
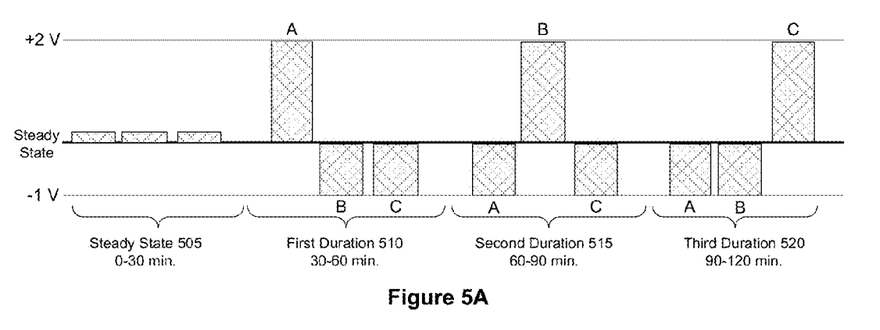
FIG. 5a depicts voltage levels applied to each of the electric power phases during various periods.
Figure 5B:
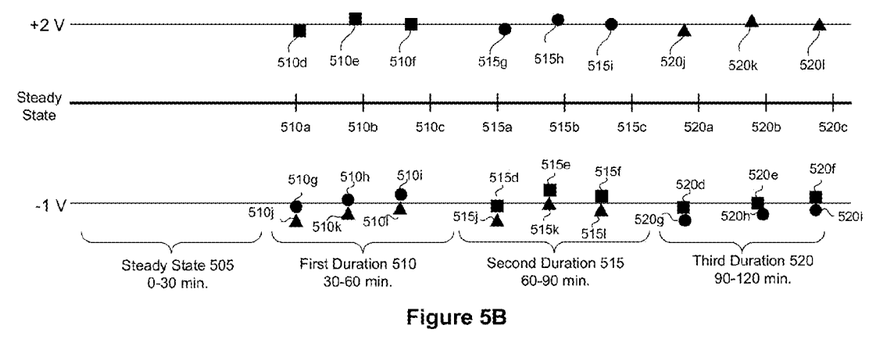

FIG. 5a and FIG. 5b work in conjunction with one another to illustrate an exemplary voltage collection process. Both figures illustrate several periods over which voltage measurements are collected: steady state 505, first period 510, second period 515, and third period 520. Each of the periods can occur at different times. For example, steady state 505 represents the initialization period from 0 minutes to 30 minutes; first period 510 ranges from 30 minutes to 60 minutes; second period 515 ranges from 60 minutes to 90 minutes; and third period 520 ranges from 90 minutes to 120 minutes.

As previously discussed, the periods may be different, e.g., more or less than 30 minutes. Additionally, each period may begin at a particular time offset. The first period 510, for example, can range from 40 minutes to 60 minutes, i.e., starting ten minutes after steady state 505 has ended. Such a time offset may be required in some implementations to allow the new voltage level to propagate throughout the nodes. The load tap changer interface 31 can apply a fixed or variable time offset between each phase, in one example. For the sake of simplicity, the time ranges in FIG. 5a and FIG. 5b do not reflect a time offset (i.e., first period 510 begins at the end of steady state period 505).

Each of the periods in FIG. 5a illustrates a phase of the distribution feeder that is varied by a certain voltage amount (e.g., +2.0 volts or −1.0 volts) with respect to the steady state voltage level. For example, Phase A is increased by 2 volts above the steady state voltage and Phase B and Phase C are decreased by 1 volt below the steady state voltage for the first period 510; Phase B is increased by 2 volts above the steady state voltage and Phase A and Phase C are decreased by 1 volt below the steady state voltage for the second period; and Phase C is increased by 2 volts above the steady state voltage and Phase A and Phase B are decreased by 1 volt below the steady state voltage for the third period.

As illustrated in FIG. 5b, the first period 510, second period 515, and third period 520 each contain time intervals at which voltage measurements are performed by Node 1, Node 2, and Node 3. For example, voltage measurements 510d, 510e, and 510f can correspond to voltage measurements taken by Node 1 at times 510a, 510b, and 510c, respectively, during the first period 510. Voltage measurements 510g, 510h, and 510i can correspond to voltage measurements taken by Node 2 at times 515a, 515b, and 515c. When, for example, Phase A is decreased by 1 volt below the steady state voltage for the second period 515 (as shown in FIG. 5a), Node 1 will perform new voltage measurements 515d, 515e, and 515f that correspond to time intervals 515a, 515b, and 515c, respectively. Voltage measurement values may also change for Node 2 and Node 3 as indicated in FIG. 5b in response to the voltage level changing as illustrated in FIG. 5a.

Returning to FIG. 3, the process resumes at step 310 where information related to the voltage measurements is received. In one implementation, the information is received after all measurements have been received for the first period 510, the second period 515, and the third period 520, as shown in FIGS. 5a and 5b. In another implementation, the information can be received at the conclusion of each period. In yet another implementation, the information may be received real-time, e.g., after each measurement is taken by a node.

Examples of the information received include the measured voltage values, an identifier associated with the node that performed the voltage measurement, the time, either absolute or relative, at which the node measured the voltage. The identifier can be a street address, device serial number, or otherwise any identifier that can associate the node with a facility or physical location where the measurement was performed. Various other data can be included in the information, at least some of the data being uniquely associated with the voltage measurements.

Figure 6:
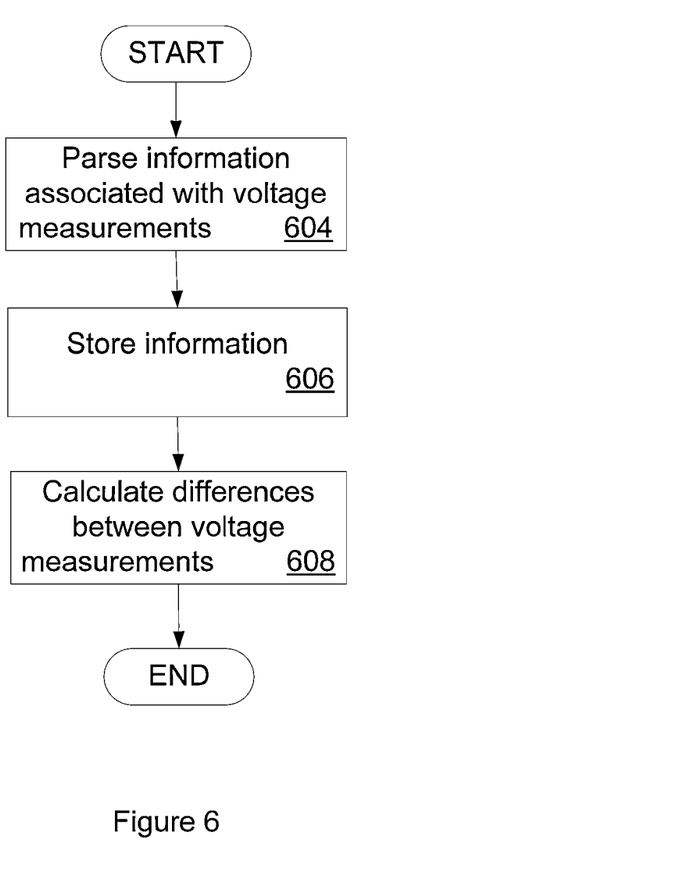
FIG. 6 depicts an exemplary computer-implemented method for processing information related to voltage measurements to determine an association between nodes and electric power phases.

The information related to the voltage measurements can be processed to determine an association between nodes and phases at step 312. FIG. 6, in conjunction with FIGS. 5a and 5b, illustrates exemplary steps for processing the information. At step 604, the information can be parsed such that voltage measurements and related information pertaining to a particular node are grouped together. The information within each node group can be further identified by the time at which the voltage measurements were performed. The information can be stored at step 606 and a calculation can be performed at step 608.

Hypothetical voltage measurements performed by three nodes (Node 1, Node 2, and Node 3) in FIG. 5b will now be considered for the purpose of illustrating an exemplary calculation at step 608. While only three nodes are identified in the hypothetical, many more nodes may exist. During the first period 510, Node 1 measured 2.1 volts above the steady state voltage (510d) at 40-minute mark 510a, 1.9 volts above the steady state voltage (510e) at 50-minute mark 510b, and 2.0 volts above the steady state voltage (510f) at 60-minute mark 510c. In one example, each of the measurements can be averaged to arrive at a representative measurement of 2.0 volts above steady state for the first period 510. As illustrated in FIG. 5b, the voltage measurements performed during a particular period may be at least slightly different. Thus, in one example, measurements can be averaged to smooth out any inconsistencies in voltage measurements, which could be due to external factors (e.g., distance from substation and temperature) which may make it more difficult for the load tap changer 40 to maintain voltage levels. In addition to an average, other mathematical functions can be performed to represent the multiple measurements taken by Node 1. In other examples, the voltage measurements can be expressed as a range. In the example above, Node 1's voltage measurements can be expressed as a range of 1.9 volts to 2.1 volts, which can also be used to provide an association between Node 1 and a phase.

A representative voltage measurement or range can be compared to an acceptable range or tolerance level for each phase to determine an association between the voltage measurement and a particular phase. In one example, an acceptable range can be +/−2% of the voltage level that is applied to a phase. For example, if a voltage of 122 volts is applied to Phase A, voltage measurements within a range of 119.6 and 124.4 (i.e., +/−2% of 122 volts) can be associated with Phase A. Similar comparisons can be performed between voltage measurements and Phase B and Phase C.

A difference between each of Node 1's voltage measurements and the steady state voltage can be calculated to provide an association between Node 1 and a phase, such as to which phase Node 1 belongs. For example, a difference equal to or within acceptable range of 2.0 volts can indicate that Node 1 is located on Phase A because the load tap changer 40 provided a voltage of 2.0 volts above the steady state voltage across 107 (Phase A) of distribution feeder 45. Thus, Node 1's measurement of 2.0 volts above steady state is reflective of its measuring the increased voltage of 2.0 volts applied to Phase A. Contrarily, a difference between Node 2 and Node 3's voltage measurements and the steady state voltage during period 510 indicates that Node 2 and Node 3 are not located on Phase A.

During the first period 510, Node 2 and Node 3 measured voltages equal to or in proximity of 1.0 volts below the steady state voltage, which indicates that Node 2 and Node 3 are both on either Phase B or Phase C. In particular, Node 2 and Node 3 measured 1.1 volts below the steady state voltage (510g and 510j) at 40-minute mark 510a, 0.9 volts below the steady state voltage (510h and 510k) at 50-minute mark 510b, and 1.0 volts below the steady state voltage (510i and 510l) at 60-minute mark 510c.

A similar calculation of Node 2's measurements for the second period 515 indicates that Node 2 is located on Phase B because its voltage measurements are equal to or within an acceptable range of the 2.0 volts above the steady state voltage to which Phase B was set for the second period 515. For example, during the second period 515, Node 2 measured 2.1 volts above the steady state voltage (515g) at 70-minute mark 515a, 1.9 volts above the steady state voltage (515h) at 80-minute mark 515b, and 2.0 volts above the steady state voltage (515i) at 90-minute mark 515c. Node 1 and Node 3's measurements during second period 515 indicate that they are not on Phase B during this period. Particularly, during the second period 515, Node 1 and Node 3 measured 1.1 volts below the steady state voltage (515d and 515j) at 70-minute mark 515a, 0.9 volts below the steady state voltage (510e and 510k) at 80-minute mark 515b, and 1.0 volts below steady state voltage value (515f and 515l) at 90-minute mark 515c.

Similar analysis for the third period 520 provides an indication that Node 3 is located on Phase C. During the third period, Node 3 measured voltages equal to or within an acceptable range of 2.0 volts above the steady state voltage to which Phase C was set for the third period 520. For example, during the third phase 520, Node 3 measured 2.1 volts above steady state voltage value (520j) at 100-minute mark 520a, 1.9 volts above the steady state voltage (520k) at 110-minute mark 520b, and 2.0 volts above the steady state voltage (520l) at 120-minute mark 520c. Node 1 and Node 2's measurements during third period 520 indicate that they are not on Phase C during this period. Particularly, during the third period 520, Node 1 and Node 2 measured 1.1 volts below steady state voltage value (520d and 520g) at 100-minute mark 520a, 0.9 volts below steady state voltage value (520e and 520h) at 110-minute mark 520b, and 1.0 volts below steady state voltage value 520f and 520i at 120-minute mark 520c.

According to some examples, the measurements and calculations need not be performed for the third period because, of the nodes that were selected to perform voltage measurements, the nodes that do not have an association with Phase A or Phase B can be associated with Phase C. Put another way, after an association has been determined for any two of the three phases, no further measurement and calculation may be required to determine an association between the remaining nodes and the remaining third phase, according to some examples. Because each of them is the only remaining nodes or phase, they necessarily can be associated with each other. Some implementations may nevertheless perform measurements during the third phase to, for example, identify nodes that may not be properly associated with any of the phases. Such nodes can have measurements that are not within the acceptable range of any of the phases. Information related to these nodes may be analyzed to determine whether troubleshooting or dispatch, for example, may be required to correct any issues that may exist at the facility associated with the nodes.

Many other modifications, features and embodiments of the present invention will become evident to those of skill in the art. Accordingly, it should be understood that the foregoing relates only to certain aspects or implementations of the invention, which are presented by way of example rather than limitation. Numerous changes may be made to the examples described herein without departing from the spirit and scope of the invention as defined by the following claims.

What is claimed is:

1. A method comprising:
    instructing a load tap changer to apply an initial voltage level to a first electric power phase, a second electric power phase, and a third electric power phase, wherein the initial voltage level is applied for an initial period;
    instructing the load tap changer to apply a first voltage to the first electric power phase and to apply a second voltage to the second electric power phase and the third electric power phase for a first period, wherein the first voltage is distinct from the second voltage;
    selecting a plurality of nodes in a mesh network based on a territory in which the nodes are located and at least one of (i) a determination that the territory is experiencing rapid growth in demand for electrical power as compared to an additional territory or that the territory is more likely to experience load imbalances as compared to the additional territory and (ii) a determination that a power delivery facility in the territory is exhibiting behavior indicative of a malfunction or inefficiency;
    instructing the selected plurality of nodes to perform a plurality of voltage measurements during the first period;
    receiving, via the mesh network, from the nodes, information related to the voltage measurements taken during the first period; and
    processing the information related to the voltage measurements taken during the first period to determine which nodes are associated with the first electric power phase.

2. The method of claim 1 further comprising:
    instructing the load tap changer to apply the first voltage to the second phase and to apply the second voltage to the first phase and the third phase for a second period;

instructing the nodes in the mesh network to perform a plurality of voltage measurements during the second period;
receiving, via the mesh network, from the nodes, information related to voltage measurements taken during the second period; and
processing the information related to the voltage measurements taken during the second period to determine which nodes are associated with the second electric power phase.

3. The method of claim 1 further comprising:
instructing the load tap changer to apply the first voltage to the third phase and to apply the second voltage to the first phase and the second phase for a third period;
instructing the nodes in the mesh network to perform a plurality of voltage measurements during the third period;
receiving, via the mesh network, from the nodes, information related to voltage measurements taken during the third period; and
processing the information related to the voltage measurements taken during the third period to determine which nodes are associated with the third electric power phase.

4. The method of claim 1, wherein for each of the nodes, the information related to the voltage measurements comprises an identifier associated with the node and a time stamp associated with at least one voltage measurement.

5. The method of claim 1 wherein at least one of the nodes sends the information related to the voltage measurements it performed to another node in the mesh network separately from sending information related to the consumption of electric power it measured.

6. The method of claim 1 wherein the processing comprises calculating a difference between the initial voltage level and the plurality of voltage measurements performed during the first period.

7. A non-transitory computer readable medium embodying computer logic that when executed on a processor performs the operations comprising:
instructing a load tap changer to apply an initial voltage level to a first electric power phase, a second electric power phase, and a third electric power phase, wherein the initial voltage level is applied for an initial period;
instructing the load tap changer to apply a first voltage to the first electric power phase and to apply a second voltage to the second electric power phase and the third electric power phase for a first period, wherein the first voltage is distinct from the second voltage;
selecting a plurality of nodes in a mesh network based on a territory in which the nodes are located and at least one of (i) a determination that the territory is experiencing rapid growth in demand for electrical power as compared to an additional territory or that the territory is more likely to experience load imbalances as compared to the additional territory and (ii) a determination that a power delivery facility in the territory is exhibiting behavior indicative of a malfunction or inefficiency;
instructing the selected plurality of nodes to perform a plurality of voltage measurements during the first period;
receiving, via the mesh network, from the nodes, information related to the voltage measurements taken during the first period; and
processing the information related to the voltage measurements taken during the first period to determine which nodes are associated with the first electric power phase.

8. The computer readable medium of claim 7 further comprising:
instructing the load tap changer to apply the first voltage to the second phase and to apply the second voltage to the first phase and the third phase for a second period;
instructing the nodes in the mesh network to perform a plurality of voltage measurements during a second period;
receiving, via the mesh network, from the nodes, information related to voltage measurements taken during the second period; and
processing the information related to the voltage measurements taken during the second period to determine which nodes are associated with the second electric power phase.

9. The computer readable medium of claim 7 further comprising:
instructing the load tap changer to apply the first voltage to the third phase and to apply the second voltage to the first phase and the second phase for a third period;
instructing the nodes in the mesh network to perform a plurality of voltage measurements during the third period;
receiving, via the mesh network, from the nodes, information related to voltage measurements taken during the third period; and
processing the information related to the voltage measurements taken during the third period to determine which nodes are associated with the third electric power phase.

10. The computer readable medium of claim 7 wherein for each of the nodes, the information related to the voltage measurements comprises an identifier associated with the node and a time stamp associated with at least one voltage measurement.

11. The computer readable medium of claim 7 wherein at least one of the nodes sends the information related to the voltage measurements it performed to another node in the mesh network separately from sending information related to the consumption of electric power it measured.

12. The computer readable medium of claim 7 wherein the processing comprises calculating a difference between the initial voltage level and the plurality of voltage measurements performed during the first period.

* * * * *